United States Patent
Ayala Vera et al.

(10) Patent No.: US 10,349,547 B1
(45) Date of Patent: Jul. 9, 2019

(54) QUICK RELEASE CHASSIS COVER

(71) Applicant: ARRIS Enterprises LLC, Suwanee, GA (US)

(72) Inventors: Julio Cesar Ayala Vera, Apodaca (MX); Oswaldo Enrique Linares Rivas, Guadalupe (MX); Carlos Gonzalez Inda, Guadalupe (MX); Sergio Antonio Delon Canseco, Guadalupe (MX); Luis Lopez Moreno, Apodaca (MX)

(73) Assignee: ARRIS Enterprises LLC, Suwanee, GA (US)

( * ) Notice: Subject to any disclaimer, the term of this patent is extended or adjusted under 35 U.S.C. 154(b) by 0 days.

(21) Appl. No.: 15/992,171

(22) Filed: May 29, 2018

(51) Int. Cl.
*G06F 1/16* (2006.01)
*H05K 7/14* (2006.01)

(52) U.S. Cl.
CPC ......... *H05K 7/1401* (2013.01); *G06F 1/1624* (2013.01); *H05K 7/1488* (2013.01); *B65D 2543/00092* (2013.01); *Y10T 292/0894* (2015.04)

(58) Field of Classification Search
CPC .. H05K 7/1401; H05K 7/1488; H05K 5/0226; H05K 5/03; H05K 7/16; G06F 1/1624; G06F 1/181; G06F 1/187; B65D 2543/00092; B65D 2543/00296; Y10T 292/0894; Y10T 292/0902; E05C 19/06; E05C 19/066; F02M 35/0203
See application file for complete search history.

(56) References Cited

U.S. PATENT DOCUMENTS

| | | | | |
|---|---|---|---|---|
| 3,840,152 | A | * 10/1974 | Hodge | B65D 21/022 206/508 |
| 4,938,513 | A | * 7/1990 | Gunderson | E05C 19/066 292/80 |
| 4,972,296 | A | * 11/1990 | Chu | H01R 13/631 211/41.17 |
| 5,295,602 | A | * 3/1994 | Swanson | F02M 35/0203 220/326 |
| 5,348,356 | A | 9/1994 | Moulton | |
| 5,634,675 | A | * 6/1997 | Mo | E05C 19/06 220/284 |
| 5,743,606 | A | 4/1998 | Scholder | |
| 5,896,624 | A | 4/1999 | Horswell | |
| 5,967,633 | A | 10/1999 | Jung | |
| 6,367,896 | B1 | 4/2002 | Peng et al. | |
| 6,457,788 | B1 | 10/2002 | Perez et al. | |
| 6,966,620 | B2 | * 11/2005 | Lai | G06F 1/181 292/DIG. 11 |
| 7,120,969 | B2 | 10/2006 | Carls | |
| 7,433,176 | B2 | 10/2008 | Kyle et al. | |
| 8,474,769 | B2 | * 7/2013 | Li | G06F 1/187 248/220.22 |

(Continued)

*Primary Examiner* — Abhishek M Rathod
(74) *Attorney, Agent, or Firm* — Lori Anne D. Swanson

(57) ABSTRACT

A chassis cover includes a cover member having a first edge and a second edge. The cover member also includes at least one latch member. The latch member or members include a cantilever arm extending distally outward from an interior of the cover member beyond the first edge by a first distance, and terminating at a loop. A latch arm extends distally inward from the loop a second distance, which may be greater than the first distance. A latching tab extends distally from an end of the latch arm.

19 Claims, 9 Drawing Sheets

(56) References Cited

U.S. PATENT DOCUMENTS

| | | |
|---|---|---|
| 9,350,083 B2 | 5/2016 | Zimmerman et al. |
| 9,804,640 B2 | 10/2017 | Cheng |
| 2001/0040797 A1 | 11/2001 | Buskmiller et al. |
| 2007/0210684 A1 | 9/2007 | Lin et al. |
| 2010/0109351 A1 | 5/2010 | Woody et al. |
| 2015/0165811 A1 | 6/2015 | Isserstedt |

* cited by examiner

QUICK RELEASE CHASSIS COVER

BACKGROUND

Technical Field

This disclosure relates generally to enclosures, and more particularly to enclosures having covers.

Background Art

Many electronic systems, including servers, computers, and information handling systems, include electrical components coupled to one or more circuit boards disposed within an enclosure. Such an enclosure, which is frequently mounted with other components in a rack, is known as "chassis." The chassis enclosure generally includes a base, which defines the chassis itself, and a cover. Traditionally, the cover is attached to the chassis with a large number of very small screws. Each screw passes through a hole in the cover to engage a threaded aperture on the chassis, thereby retaining the cover to the chassis base.

The use of so many screws is problematic. Illustrating by example, during maintenance or other operations where the cover must be removed from the chassis base, each and every screw must be removed and replaced. Sometimes this removal and replacement must occur several times, which is tedious, time consuming, and costly. It would be advantageous to have an improved chassis cover that provides robust coupling to a chassis base, but that is quicker and easier to attach and remove from the chassis base.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and to explain various principles and advantages all in accordance with the present disclosure.

Figure 1:
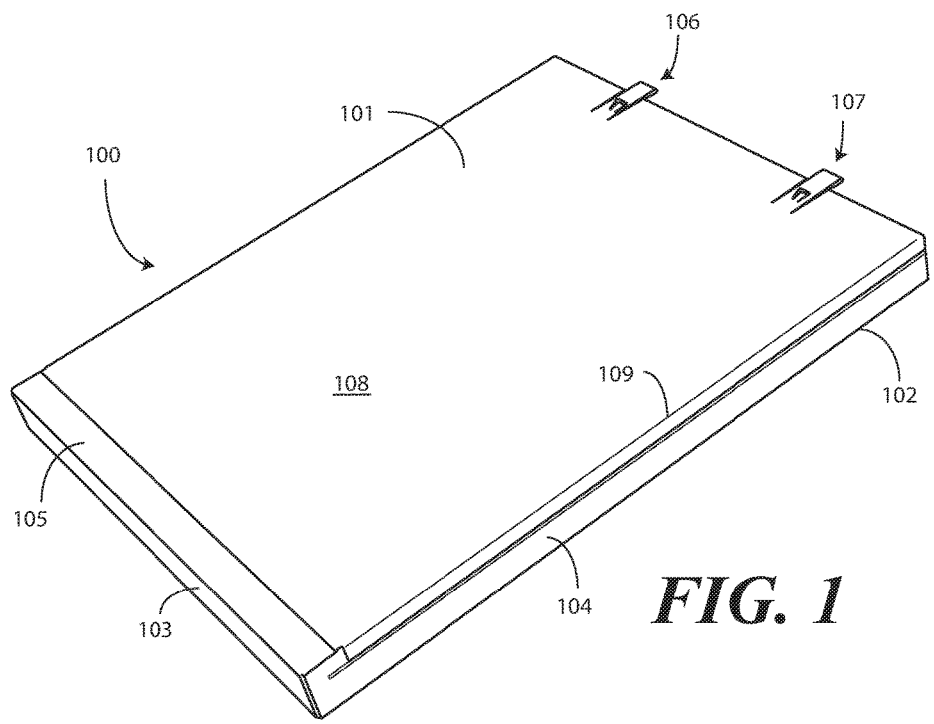
FIG. 1 illustrates a perspective view of one explanatory assembled chassis in accordance with one or more embodiments of the disclosure.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present disclosure.

DETAILED DESCRIPTION OF THE DRAWINGS

Embodiments of the disclosure are now described in detail. Referring to the drawings, like numbers indicate like parts throughout the views. As used in the description herein and throughout the claims, the following terms take the meanings explicitly associated herein, unless the context clearly dictates otherwise: the meaning of "a," "an," and "the" includes plural reference, the meaning of "in" includes "in" and "on." Relational terms such as first and second, top and bottom, and the like may be used solely to distinguish one entity or action from another entity or action without necessarily requiring or implying any actual such relationship or order between such entities or actions. The terms "substantially" and "about" are used to refer to dimensions, orientations, or alignments inclusive of manufacturing tolerances. Thus, a "substantially orthogonal" angle with a manufacturing tolerance of plus or minus two degrees would include all angles between 88 and 92, inclusive. Also, reference designators shown herein in parenthesis indicate components shown in a figure other than the one in discussion. For example, talking about a device (10) while discussing figure A would refer to an element, 10, shown in figure other than figure A.

Embodiments of the disclosure contemplate that an attachment coupling between a chassis base and a chassis cover needs to be robust. The coupling must be able to withstand chassis handling, such as during transportation and installation. Moreover, embodiments of the disclosure contemplate that attachment and removal of the chassis cover from the chassis base needs to be easy, both for manufacturing purposes and for maintenance of the components within the chassis.

Prior art chassis covers provide neither advantage, as it is difficult to attach and remove prior art covers from the chassis base due to the large number of screws required. During servicing or other operations in which the cover needs to be removed from the base, unscrewing the numerous screws is time consuming and can be problematic. A technician must have the proper tools, and then must take the time to tediously remove each screw, keep track of the same, and then replace each screw when the maintenance operation or other operation is completed.

Advantageously, embodiments of the disclosure provide solutions to these and other problems by providing an improved chassis cover. In one or more embodiments, the chassis cover comprises a cover member having a first edge and a second edge. The chassis cover also comprises at least one latch member. The latch member is designed for quick and easy coupling of the chassis cover to the chassis base.

In one or more embodiments, the latch member comprises a cantilever arm extending distally outward from an interior of the cover member beyond the first edge by a first distance. In one or more embodiments, the cantilever arm terminates at a loop. In one or more embodiments, a latch arm extends distally inward from the loop a second distance. In one or more embodiments the second distance, at which the latch arm extends inward from the loop, is greater than the first distance, at which the cantilever arm extends beyond the first edge of the cover member. In one or more embodiments, a latching tab extends distally from an end of the latch arm. In one or more embodiments, the cantilever arm defines a dovetail protuberance that extends distally from the cantilever arm toward the latching tab to a nadir.

This solution, along with its corresponding method of attaching and detaching the chassis cover from a chassis base, saves substantial amounts of time when the chassis cover needs to be attached to, or removed from, a chassis base. Advantageously, the dovetail protuberance engages a sidewall of the chassis base to robustly retain and couple the chassis cover to the chassis base. Moreover, in one or more embodiments the latching tab is designed to easily insert into openings located in the rear sidewall of the chassis base. Advantageously, inclusion of the cantilever arm, latch arm and tab, and dovetail protuberance eliminates the need for any screws to retain the chassis cover to the chassis base. Advantageously, during a chassis cover attachment or removal procedure, embodiments of the disclosure eliminate the need for tools, eliminate the need for screws, and reduce the overall assembly and disassembly operation duration.

Moreover, embodiments of the disclosure reduce the overall part count included in an assembled chassis. While prior art attempts at reducing part count have been tried, such as in U.S. Pat. No. 5,743,606 to Scholder, these attempts fail to reduce the part count sufficiently. Illustrating by example, the '606 patent requires additional components between chassis base and chassis cover to achieve a satisfactory coupling. By contrast, embodiments of the disclosure only require the cover and base—no additional components are required. The one or more latch members are completely integrated into the chassis cover as a unitary component, thereby providing quick and simple, tool-less assembly and disassembly. Embodiments of the disclosure reduce the laborious task of removing and attaching screws, as was required in prior art designs. Moreover, embodiments of the disclosure advantageously eliminate the need for additional hardware components to secure the chassis cover to the chassis base. Other benefits and advantages will be described below. Still others will be obvious to those of ordinary skill in the art having the benefit of this disclosure.

Other prior art attempts at providing improved chassis covers have been similarly deficient to that described by the '606 patent. Illustrating by example, U.S. Pat. No. 5,967,633 to Jung teaches a chassis assembly for computers. In this chassis assembly, the main chassis and bottom chassis are suitable for being manually assembled and disassembled. The main chassis, having front and rear panels, is open at the bottom between the lower edges of the front and rear panels. The bottom chassis is detachably mounted to the open bottom of the main chassis. The chassis assembly also has a lock unit that is mounted to the rear portion of the bottom chassis. The lock unit normally retains the position of the bottom chassis relative to the main chassis and selectively allows the bottom chassis to be manually removed from the main chassis.

Embodiments of the disclosure provide numerous advantages over the '633 patent. The primary advantage is that embodiments of the disclosure require only two components to couple a chassis cover to a chassis base, namely, the chassis cover and the chassis base. The '633 patent requires a third component, which must task the lock to complete the assembly and to prevent the assembly from becoming loose.

U.S. Pat. No. 6,457,788 to Perez et al. describes a protective assembly for housing. The protective assembly has a chassis, a cover, and a flexible latch for securing the cover to the chassis. The flexible latch has a latch and the base has a catch. The base includes a fulcrum. The fulcrum is used during removal of the cover to pivot the latch so that the latch is brought free of the catch.

Embodiments of the disclosure provide numerous advantages over the '788 patent. To wit, in one or more embodiments a chassis cover described below includes a dovetail protuberance extending distally from a cantilever arm. In one or more embodiments, this dovetail protuberance has a triangular cross section at its base. This dovetail protrusion advantageously prevents and reduces risk of the chassis cover material being deformed beyond its yield strength.

U.S. Pat. No. 5,348,356 to Moulton describes a hidden, releasable latch for a molded plastic enclosure having a first panel abutting a second panel along a seam. The first panel has a pressure bump on its inside surface a first distance from the seam, and a projecting tang on its inside surface at a further distance from the seam. The second panel has a tab from its inside surface projecting inside, parallel and spaced from the inside surface of the first panel, the tab contacting the pressure bump, and capturing the projecting tang in a hole within the tab. The tab is flexible enough for slight deflection during the capturing of the tang by the hole during an assembly process, and the releasing of the tang by movement of the tab from pressure from the pressure bump during a disassembly process. The reference requires the use of a tool to apply an external force to the tab to deflect it and release it from the hole.

Embodiments of the disclosure provide numerous advantages over the '356 patent. In addition to other advantages, the principal benefit of using embodiments of the disclosure described below is that no tools are required. A second advantage is that the latch members described below are formed into the chassis cover as a unitary part. Moreover, force can be applied directly to the latch member with fingers, without the need of an intermediate component being used as a lever.

US Published Patent Application No. 2007/0210684 to Lin et al. describes a computer enclosure that includes a chassis, a latch member, and a cover plate. The chassis includes a rear panel, and an opening. The cover plate covers the opening and depends a flange with a pair of holes defined therein. The rear panel defines a pair of slots therein. The latch member is pivotably attached to the rear panel and includes a pair of spaced resilient arms. A pair of grooves and a pair of hooks is formed at opposite ends of the resilient arms. The grooves of the latch member engage with the rear panel adjacent the slots and the hooks movably engage in the through holes of the flange of the cover plate when the resilient arms are deformed. This reference also considers a third component that works as a latch to lock the complete assembly between cover and chassis. Our disclosure describes an assembly between only two components, chassis and cover.

Embodiments of the disclosure provide numerous advantages over the '684 publication. In particular, embodiments described below include features designed with a unique geometry to lock the chassis assembly, while at the same time provide support when the chassis cover needs to be removed from the chassis base. While the advantages over these prior art references point to just a few ways in which embodiments of the disclosure are distinct and advantageous over prior attempts at providing an improved chassis system, numerous others will be obvious to those of ordinary skill in the art having the benefit of this disclosure.

Figure 2:
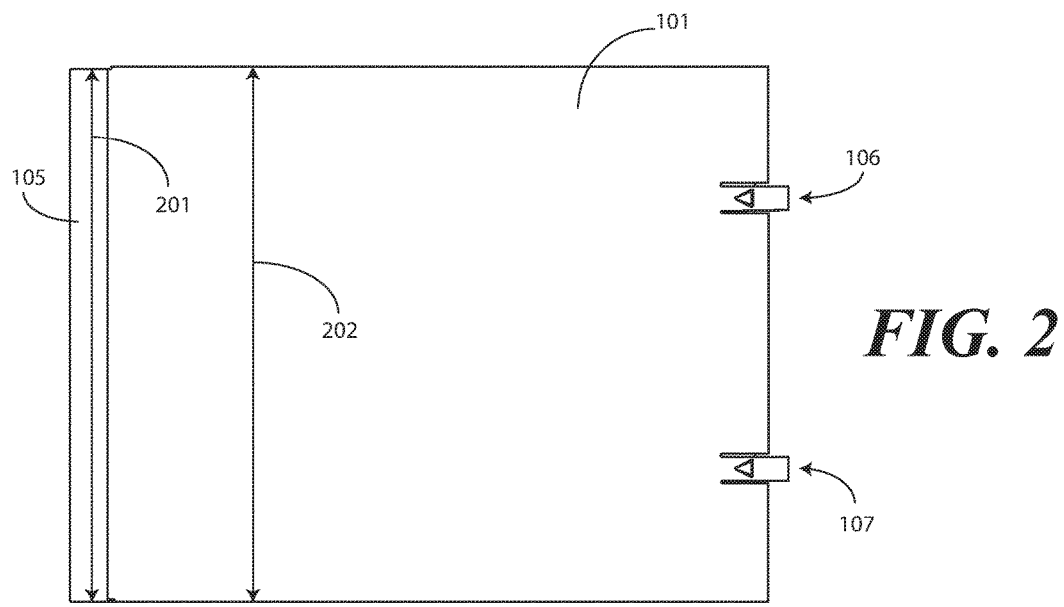
FIG. 2 illustrates a top plan view of one explanatory assembled chassis in accordance with one or more embodiments of the disclosure.
Figure 3:
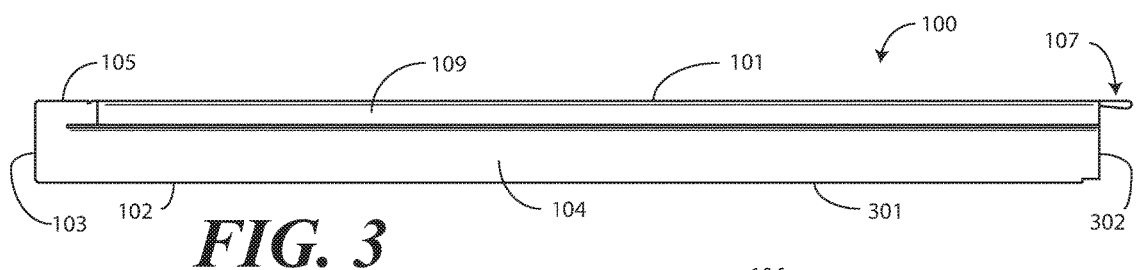
FIG. 3 illustrates a side elevation view of one explanatory assembled chassis in accordance with one or more embodiments of the disclosure.

Turning now to FIGS. 1-3, illustrated therein is an assembled chassis 100 in accordance with one or more embodiments of the disclosure. The chassis is an "assembled" chassis because a chassis cover 101 configured in accordance with one or more embodiments of the disclosure is coupled to a chassis base 102. FIG. 1 illustrates a perspective view of the assembled chassis 100, while FIG. 2 illustrates a top plan view of the assembled chassis 100. FIG. 3 illustrates a side elevation view of the assembled chassis 100.

The assembled chassis 100 can be used to house electrical components, and in particular rack mountable electrical components. Examples of such electrical components include computers, file servers, mainframe computer components, content delivery server components and so forth. For example, the chassis base 102 can define a cabinet for storing, holding, or retaining such electronic components. Other electronic components suitable for placement within such an assembled chassis will be obvious to those of ordinary skill in the art having the benefit of this disclosure.

The chassis cover 101 and the chassis base 102 can be manufactured from various materials. Moreover, the chassis cover 101 can be manufactured from the same material, or alternatively from different materials. Illustrating by example, in one or more embodiments the chassis cover 101 and the chassis base 102 are both manufactured from metal. In another embodiment, the chassis cover 101 is manufactured from metal, while the chassis base 102 is manufactured from a thermoplastic material. The use of metal for one or both of the chassis cover 101 and the chassis base 102 can be advantageous in that it can be used for electrical grounding, as well as being strong and relatively light. Other materials suitable for manufacturing the chassis cover 101 and the chassis base 102 will be obvious to those of ordinary skill in the art.

The chassis base 102 defines a receiver for electrical components or other items. The chassis base 102 includes a base 301 and one or more sidewalls 103,104,302. In this illustrative embodiment each sidewall of the one or more sidewalls 103,104,302 extends substantially orthogonally from the base 301, which is substantially planar in this illustrative embodiment. The chassis cover 101 is placed atop the chassis base 102, thereby spanning an opening defined by the one or more sidewalls 103,104,302. To access components disposed within the assembled chassis 100, the chassis cover 101 is removed from the chassis base 102, thereby exposing the opening defined by the one or more sidewalls 103,104,302, as well as an interior area bounded by the base 301 and the one or more sidewalls 103,104,302.

In one or more embodiments, the width 201 of the chassis base 102 is slightly less than the width 202 of the chassis cover 101 such that the one or more sidewalls 103,104,302 support the chassis cover 101 when the chassis cover 101 is coupled to the chassis base 102. Said differently, this difference between the width 201 of the chassis base 102 and the width 202 of the chassis cover 101 allows the cross-sectional width of the sidewalls 104,302 to engage and support the planar underside of the chassis cover 101 when the chassis cover 101 is coupled to the chassis base 102.

In one or more embodiments, the chassis cover 101 engages the chassis base 102 at two locations. A front engagement occurs where an offset extension (shown below with reference to FIG. 4) of the chassis cover 101 engages a receiver ledge 105 of the chassis base 102. A second engagement occurs at the rear where one or more latch members 106,107 engage the rear sidewall 302 of the chassis base 102. In addition to these two engagements, the cross-sectional width of sidewall 104, its mirror image situated at the top of FIG. 2 or into the page in FIG. 3, and the rear sidewall 302 supports the planar underside of the chassis cover 101 when the chassis cover 101 is coupled to the chassis base 102.

In one or more embodiments, the chassis cover 101 comprises a cover member 108 that is substantially planar. In this illustrative embodiment, the chassis cover 101 also includes a pair of partial sidewalls 109 that extend distally from the cover member 108 to partially wrap around the left and right sidewalls 104 of the chassis base 102. In some embodiments, these partial sidewalls 109 will be omitted.

Figure 4:
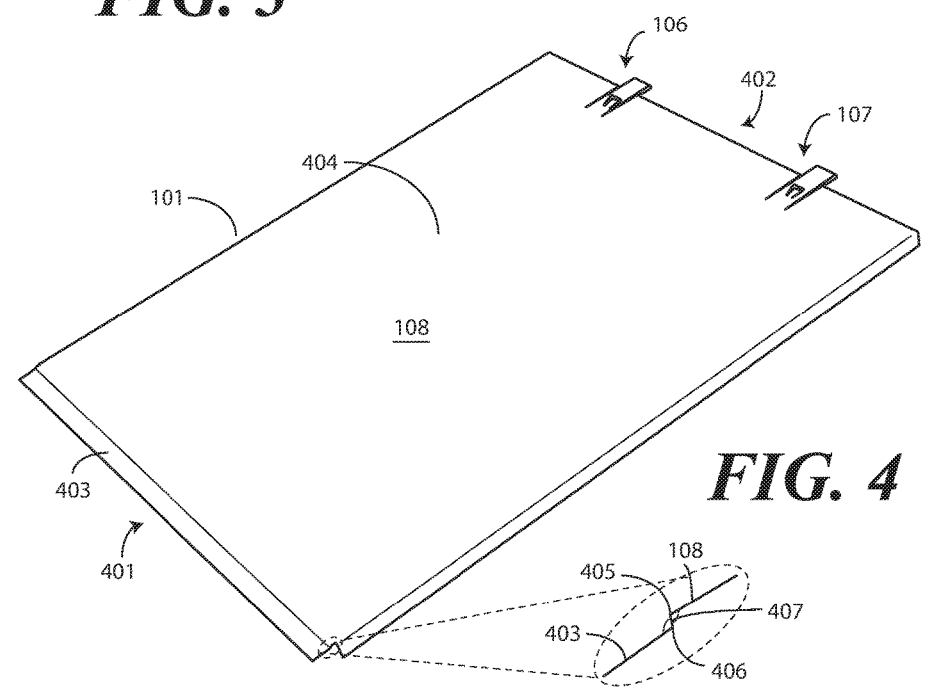
FIG. 4 illustrates a perspective view of one explanatory chassis cover in accordance with one or more embodiments of the disclosure.
Figure 5:
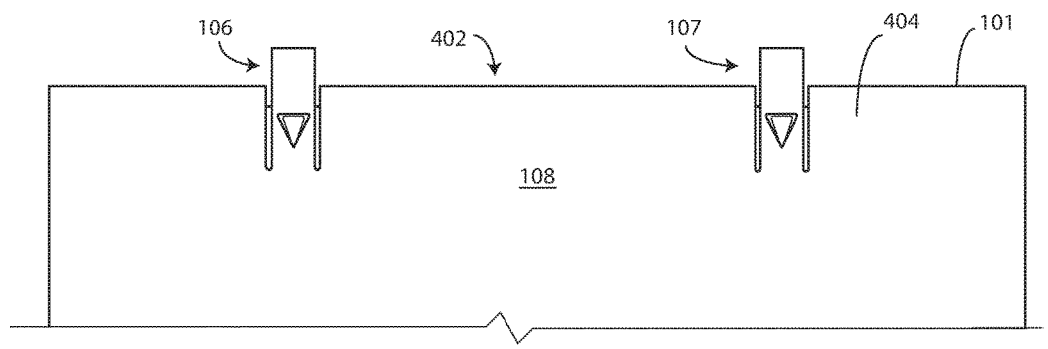
FIG. 5 illustrates a top plan view of a portion of one explanatory chassis cover in accordance with one or more embodiments of the disclosure.

Turning now to FIGS. 4 and 5, illustrated therein is the chassis cover 101 from FIG. 1 decoupled from the chassis base (102). FIG. 4 illustrates a perspective view of the chassis cover 101, while FIG. 5 illustrates a partial top plan view of the chassis cover 101.

In one or more embodiments, the cover member 108 is substantially planar. It should be noted that features, components, openings, or other structures could be configured into, or coupled to, the cover member 108 in one or more embodiments. In one or more embodiments, the cover member 108 has a first edge 401 and a second edge 402. In this illustrative embodiment, the first edge 401 is the "front" edge, in that it engages the front end of a chassis base (102). The second edge 402 is the "rear" edge, in that it engages the rear sidewall (302) of the chassis base (102).

In this illustrative embodiment, the first edge 401 defines an offset extension 403 that is parallel, but non-coplanar, with the outer major face 404 defined by the cover member 108. As shown in FIG. 4, the cover member 108 terminates at a first substantially orthogonal angle 405. An intermediate extension 407 then extends distally downward from the cover member 108 to a second substantially orthogonal angle 406. The offset extension 403 then extends distally away from the intermediate extension 407. This results in the offset extension 403 being parallel, but non-coplanar, with the cover member 108. As will be described in more detail below with reference to FIG. 13, in one or more embodiments the offset extension 403 of the chassis cover 101 engages a receiver ledge (105) of the chassis base (102) to retain the first edge 401 of the chassis cover 101 to the front end of the chassis base (102) in one or more embodiments.

As noted above, in one or more embodiments the chassis cover 101 comprises at least one latch member 106,107. In this illustrative embodiment, the chassis cover 101 comprises two latch members 106,107. However, in other embodiments the chassis cover 101 can comprise more, or fewer, than two latch members 106,107 as well.

In one or more embodiments, the latch members 106,107 and the cover member 108 are manufactured from a single piece of material as a singular, unitary component. As will be described in more detail below, in one or more embodiments each latch member 106,107 comprises a cantilever arm, a latch arm, a latching tab, and optionally a dovetail protuberance. In one or more embodiments, these features, along with the cover member 108, are manufactured from a single, unitary sheet of stainless steel having a thickness of about 0.92 millimeters or 0.036 inches. The various features of each latch member 106,107 can be manufactured by bending, shaping, and tooling portions of the single, unitary sheet of stainless steel after it has been cut with a die. The use of metal with this—or a similar thickness—allows arms of the latch members 106,107 to function as cantilever arms due to the springy nature of the stainless steel, which can bend without deforming. In place of stainless steel, other springy metals or springy plastics or other springy materials can be used to create the singular, unitary chassis cover 101 having the integrated latch members 106,107.

Turning now to FIGS. 6-9, illustrated therein are various views of one explanatory latch member 107 configured in accordance with one or more embodiments of the disclosure. Because the operation of latch member 107 is functionally identical to the operation of latch member (106), with the latter being a mirror image of the former, the description below of the operation of latch member 107 serves to describe the operation of latch member (106) as well.

Figure 6:
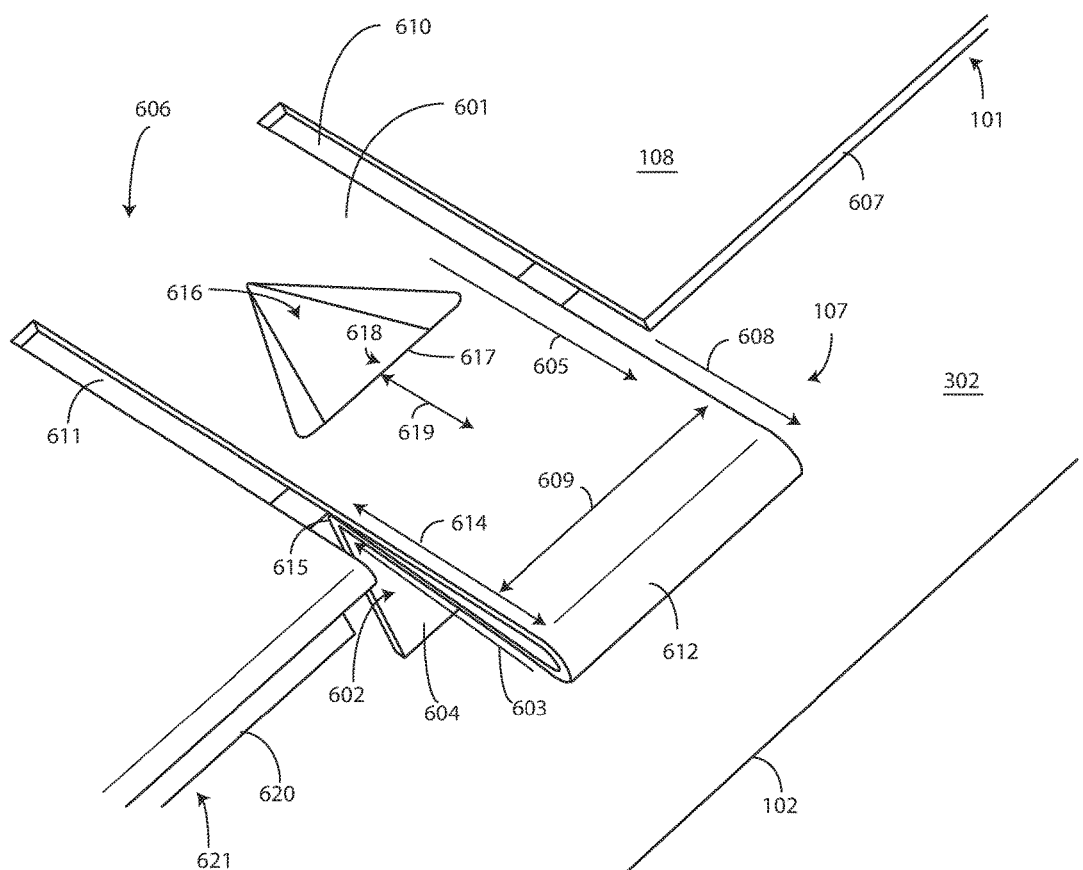
FIG. 6 a first perspective view of one explanatory latch member, engaging a chassis base, in accordance with one or more embodiments of the disclosure.
Figure 7:
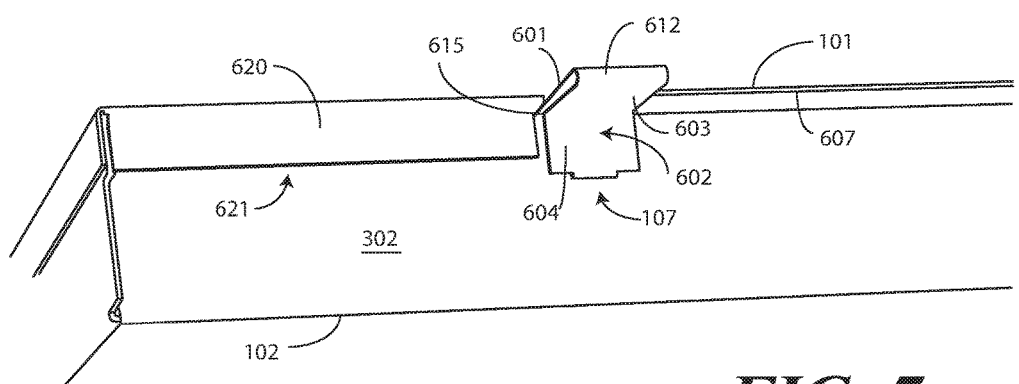
FIG. 7 illustrates a second perspective view of one explanatory latch member, engaging a chassis base, in accordance with one or more embodiments of the disclosure.
Figure 8:
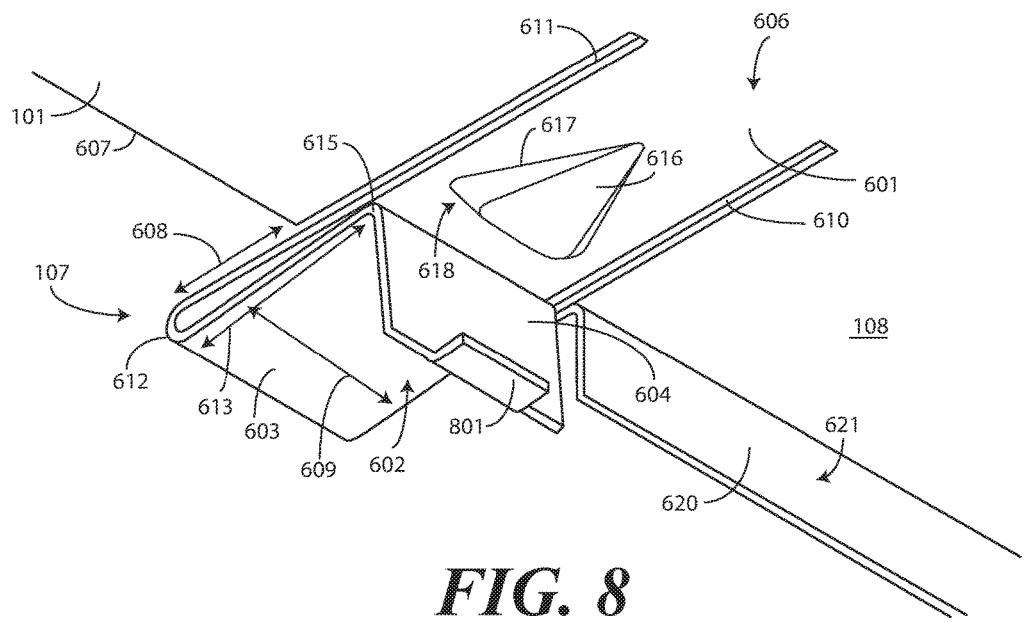
FIG. 8 illustrates a third perspective view of one explanatory latch member in accordance with one or more embodiments of the disclosure.
Figure 9:
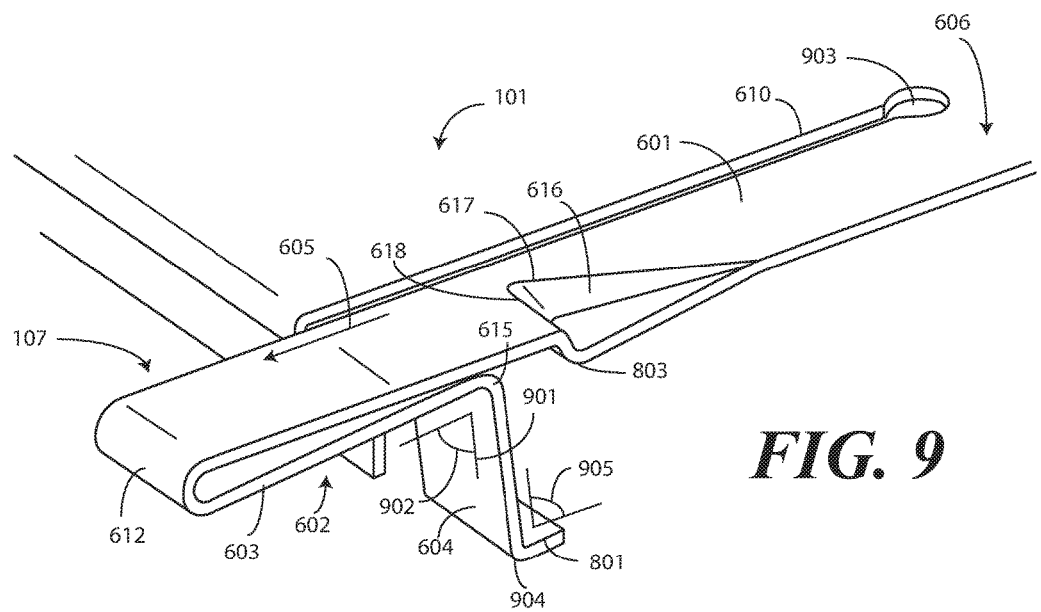
FIG. 9 illustrates a sectional view of one explanatory latch member in accordance with one or more embodiments of the disclosure.

FIG. 6 illustrates a first perspective view of latch member 107, engaging the rear sidewall 302 of the chassis base 102, while FIG. 7 illustrates another perspective view of the latch member 107 engaging the rear sidewall 302 of the chassis base 102. FIG. 8 illustrates a perspective view of the latch member 107 when the chassis cover 101 is detached from the chassis base 102, while FIG. 9 provides a sectional view of the latch member 107 when the chassis cover 101 is detached from the chassis base 102. These views, taken in combination, provide illustrations of the various functional components of the latch member 107.

In one or more embodiments, the latch member 107 comprises a cantilever arm 601, a latch arm 602, and a latching tab 801. In this illustrative embodiment, the latch arm 602 comprises a major latch arm 603 and a minor latch arm 604. As best shown in FIG. 9, in one or more embodiments the major latch arm 603 and the minor latch arm 604 define a L-shape 901 due to the fact that the minor latch arm 604 extends at a substantially orthogonal angle 902 from the major latch arm 603.

In one or more embodiments, the cantilever arm 601 extends 605 distally outward from an interior 606 of the cover member 108 beyond a first edge 607 of the cover member 108 by a first distance 608. In one or more embodiments, the first distance 608 is between fifteen and twenty millimeters from the first edge 607 of the cover member 108. In one or more embodiments, the first distance 608 is about seventeen millimeters.

In one or more embodiments, the cantilever arm 601 has a width 609 of between eighteen and twenty-two millimeters. In one or more embodiments, the width 609 is about twenty millimeters. In one or more embodiments, the cantilever arm 601 is bounded on each side by a slot 610,611. Each slot 610,611 defines a long, narrow aperture or slit in the cover member 108 that provides a physical separation space between the cantilever arm 601 and the cover member 108. In one or more embodiments, each slot 610,611 is between one and three millimeters wide, and is formed by cutting the cover member from the first edge 607 a depth of between thirty-five and forty millimeters. For example, in one or more embodiments each slot 610,611 is about two millimeters wide and extends into the interior 606 of the cover member 108 from the first edge 607 a distance of about thirty-eight to thirty-nine millimeters. In one or more embodiments, each slot 610,611 helps to prevent and/or reduce the risk for the cantilever arm 601 to be deformed beyond its yield strength.

In one or more embodiments, each slot 610,611 can terminate at a stress relief aperture 903. The illustrative stress relief aperture 903 shown in FIG. 9 has a circular cross section. However, in other embodiments the cross section of the stress relief aperture 903 can take different shapes, such as polygonal, free form shapes, ovular shapes, elliptical shapes, and so forth. In one or more embodiments the width of the stress relief aperture 903 will be greater than the width of the slot 610,611 to which it connects. In some embodiments, such as those shown in FIGS. 6-8, the stress relief aperture 903 will be omitted. Where included, the stress relief aperture 903 further 611 helps to prevent and/or reduce the risk for the cantilever arm 601 to be deformed beyond its yield strength.

In one or more embodiments, as shown in FIG. 9, the cantilever arm 601 extends 605 distally from an interior 606 of the cover member 108 beyond the first edge 607 of the cover member 108, and terminates at a loop 612. In one or more embodiments, due to the springy nature of the material from which the chassis cover is manufactured, the latch arm 602 is bendably connected to the cantilever arm 601 by the loop 612. More particularly, the major latch arm 603 is bendably connected to the cantilever arm 601 by the loop 612. (The minor latch arm 604 is bendably connected to the major latch arm 603 by the junction bend 615 defined by the intersection of the major latch arm 603 and the minor latch arm 604.) In one or more embodiments, portion of the cantilever arm 601, the loop 612, and a portion of the latch arm 602 define a teardrop cross section, which is shown in FIGS. 12-16.

In one or more embodiments, the loop 612 biases the junction bend 615 defined by the intersection of the major latch arm 603 and the minor latch arm 604 against the cantilever arm 601. Said differently, in one or more embodiments the loop 612 applies a preloading force causing the junction bend 615 defined by the intersection of the major latch arm 603 and the minor latch arm 604 against the cantilever arm 601 to define a pinch between the junction bend 615 defined by the intersection of the major latch arm 603 and the minor latch arm 604 against the cantilever arm 601. In other embodiments, the loop 612 can be configured to leave a space between the junction bend 615 defined by the intersection of the major latch arm 603 and the minor latch arm 604 against the cantilever arm 601.

In one or more embodiments, the latch arm 602 then extends 613 distally inward, i.e., back toward the interior 606 of the cover member 108, by a second distance 614. More particularly, the major latch arm 603 extends 613 distally inward toward the interior 606 of the cover member 108 by the second distance 614 in one or more embodiments. In one or more embodiments, the second distance 614, i.e., the amount that the major latch arm 603 extends 613 distally inward toward the interior 606 of the cover member 108, is greater than the first distance 608 the cantilever arm 601 extends 605 distally outward from an interior 606 of the cover member 108 beyond a first edge 607 of the cover member 108.

In one or more embodiments, the latching tab 801 extends distally away from an end of the latch arm 602. More particularly, in this illustrative embodiment the latching tab 801 extends distally away from an end of the minor latch arm 604. In this illustrative embodiment, the latching tab 801 is shorter in length than is the minor latch arm 604.

As with the major latch arm 603 and the minor latch arm 604, in one or more embodiments the latching tab 801 extends distally from the minor latch arm 604 at a substantially orthogonal angle 805. This results in the latching tab 801 and the minor latch arm 604 defining a second L-shape 904. This also results, in this illustrative embodiment, with the major latch arm 603 and the latching tab 801 being substantially parallel. As best shown in FIG. 8, in this illustrative embodiment the latching tab 801 has a width that is less than that of the minor latch arm 604. In other embodiments, the latching tab 801 can have a width that is equal to, or even greater than, the width of the minor latch arm 604.

As best seen in FIGS. 6, 8, and 9, in one or more embodiments the cantilever arm 601 defines a dovetail protuberance 616. In one or more embodiments, the dovetail protuberance 616 extends distally from the cantilever arm 601 toward the latching tab 801. In this illustrative embodiment, the dovetail protuberance 616 extends distally from the cantilever arm 601 toward the latching tab 801 and terminates at a nadir 803.

In one or more embodiments, the dovetail protuberance 616 defines a base 617 at the cantilever arm 601. In this illustrative embodiment, the base 617 of the dovetail protuberance 616 is triangular in cross section. However, the base 617 of the dovetail protuberance 616 can take other shapes as well. In another embodiment, the base 617 of the dovetail protuberance 616 is rectangular in cross section. In another embodiment, the base 617 of the dovetail protuberance 616 is polygonal in cross section. In another embodiment, the base 617 of the dovetail protuberance 616 is ovular in cross section. In another embodiment, the base 617 of the dovetail protuberance 616 has a free-form shape. Other shapes for the base 617 of the dovetail protuberance 616 will be obvious to those of ordinary skill in the art having the benefit of this disclosure.

In this illustrative embodiment, a first side 618 of the base 617 of the dovetail protuberance 616 is substantially parallel with the first edge 607 of the cover member 108. In other embodiments, an apex of the triangular cross section can point toward (rather than away from as is shown in FIGS. 6, 8, and 9) the first edge 607 of the cover member 108. However, by making the first side 618 of the base 617 of the dovetail protuberance 616 parallel with the first edge 607 of the cover member 108, better engagement of the latch member 107 with the chassis base (102) can be achieved.

In one or more embodiments, the length of the first side 618 of the base 617 of the dovetail protuberance 616 is between ten and fifteen millimeters. For example, in one embodiment the length of the first side 618 of the base 617 of the dovetail protuberance 616 is between thirteen and fourteen millimeters. In one or more embodiments, the distance between the first side 618 of the base 617 of the dovetail protuberance 616 and the apex of the triangular cross section is about fifteen millimeters as well.

In one or more embodiments, as best shown in FIGS. 6, 8, and 9, the dovetail protuberance 616 is situated interior of the first edge 607 of the cover member 108 by a predefined distance 619. In one or more embodiments, this predefined distance 619 is between ten and fifteen millimeters. For example, in one embodiment the predefined distance 619 is between twelve and thirteen millimeters.

In one or more embodiments, as best shown in FIGS. 6-8, the first edge 607 of the cover member 108 is situated to a first side of the latch member 107. In one or more embodiments, as shown in FIGS. 6 and 8, a portion 620 of the cover member 108 is folded over the substantially planar portion of the cover member 108 to define an abutment surface 621. In other embodiments, as shown in FIG. 7, the portion 620 of the cover member 108 is simply folded orthogonally relative to the substantially planar portion of the cover member 108. In one or more embodiments, the abutment surface 621 extends substantially orthogonally from the substantially planar portion of the cover member 108. As will be described below with reference to FIGS. 10-14, this abutment surface 621 works to limit insertion of the chassis cover 101 across the chassis base (102).

Figure 10:
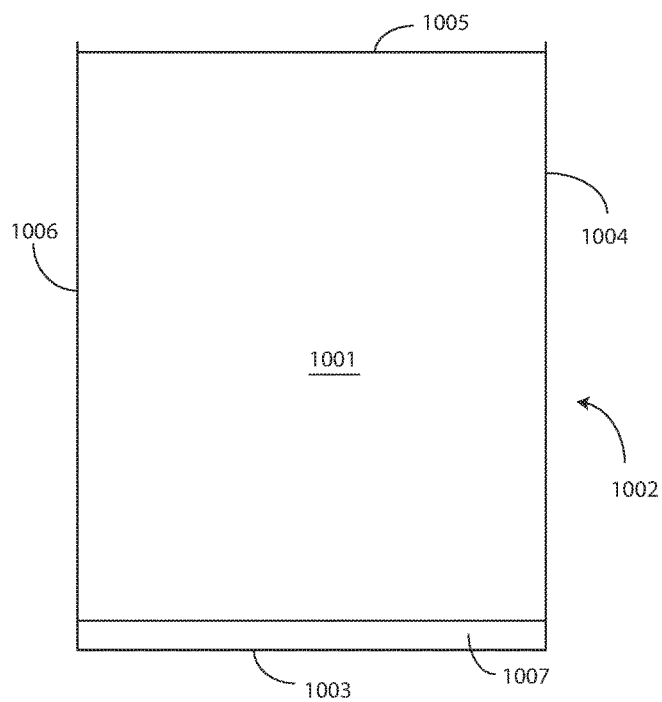
FIG. 10 illustrates a top plan view of one explanatory chassis base in accordance with one or more embodiments of the disclosure.

It should be noted that the chassis cover 101 can be used with different types of chassis bases. Turning now to FIG. 10, illustrated therein is a top plan view of a first chassis base 1002 configured in accordance with one or more embodiments of the disclosure. As before, the chassis base 1002 includes a base 1001 and one or more sidewalls 1003,1004, 1005,1006. In this illustrative embodiment each sidewall of the one or more sidewalls 1003,1004,1005,1006 extends substantially orthogonally from the base 1001, which is substantially planar in this illustrative embodiment.

In this illustrative embodiment, the front end of the chassis base 1002 includes a vertical sidewall 1003 that extends distally from the base 1001 and terminates at a receiver ledge 1007. As described above, a chassis cover (101) configured in accordance with one or more embodiments of the disclosure can engage the front end of the chassis base 1002 when its offset extension (403) engages the receiver ledge 1007 by sliding under the receiver ledge 1007.

In this illustrative embodiment, the rear end of the chassis base 1002 includes a vertical sidewall 1005 that extends distally from the base 1001. When the chassis cover (101) slides across (downward as viewed in FIG. 10) the chassis base 1002, with the offset extension (403) sliding under the receiver ledge 1007, the dovetail protuberances (616) cause the cantilever arms (601) to deflect. Once the first side (618) of the base (617) of the dovetail protuberances (616) has passed over the sidewall 1003, the cantilever arms (601) reverse the deflection, with the first side (618) of the base (617) of the dovetail protuberances (616) situated to one side of the sidewall 1005, and the abutment surfaces (621) situated to the other.

Figure 11:
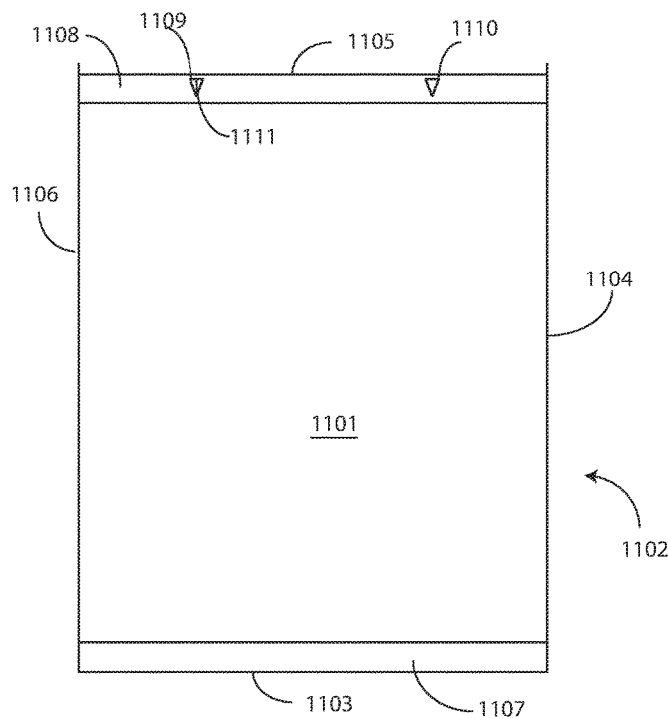
FIG. 11 illustrates a top plan view of another explanatory chassis base in accordance with one or more embodiments of the disclosure.

Turning now to FIG. 11, illustrated therein is another chassis base 1102 in accordance with one or more embodiments of the disclosure. As before, the chassis base 1102 includes a base 1101 and one or more sidewalls 1103,1104, 1105,1106. In this illustrative embodiment each sidewall of the one or more sidewalls 1103,1104,1105,1106 extends substantially orthogonally from the base 1101, which is substantially planar in this illustrative embodiment.

As before, the front end of the chassis base 1102 includes a vertical sidewall 1103 that extends distally from the base 1101 and terminates at a receiver ledge 1107. A chassis cover (101) configured in accordance with one or more embodiments of the disclosure can engage the front end of the chassis base 1102 when its offset extension (403) engages the receiver ledge 1107 by sliding under the receiver ledge 1107.

In this illustrative embodiment, the rear end of the chassis base 1102 includes a vertical sidewall 1105 that extends distally from the base 1101 and terminates at a support ledge 1108. As shown in FIG. 11, the support ledge 1108 includes two apertures 1109,1110 that are complementary in shape to the dovetail protuberances (616) of the latch members (107) of the chassis cover (101). When the chassis cover (101) slides across (downward as viewed in FIG. 11) the chassis base 1102, with the offset extension (403) sliding under the receiver ledge 1107, the dovetail protuberances (616) cause the cantilever arms (601) to deflect. Once the dovetail protuberances (616) pass atop the apertures 1109,1110, the cantilever arms (601) reverse the deflection, thereby causing the dovetail protuberances (616) to situate within the apertures 1109,1110. This results in the first side (618) of the base (617) of the dovetail protuberances (616) situated against a first side 1111 of the apertures 1109,1110. Abutment surfaces (621) of the chassis cover (101) are then situated against the exterior of the rear sidewall 1105.

Figure 12:
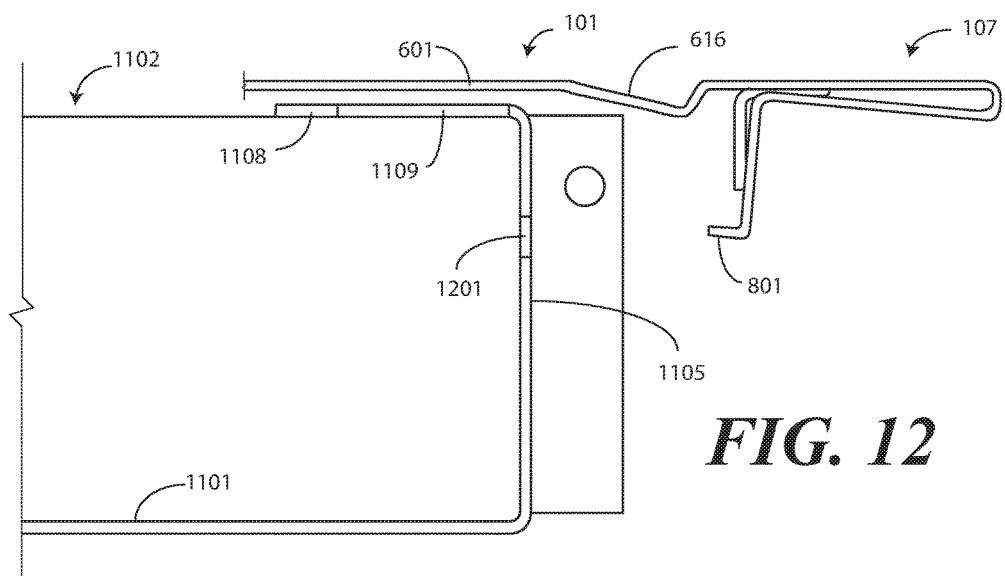
FIG. 12 illustrates one or more method steps in accordance with one or more embodiments of the disclosure.

This engagement between the chassis base 1102 of FIG. 11 and the chassis cover (101) is shown in detail in FIGS. 12-16. Turning now to FIG. 12, the chassis cover 101 is positioned above the chassis base 1102, with the latch member 107 disposed to the right of the rear sidewall 1105. Also shown in FIG. 12 are the base 1101 of the chassis base 1101, the support ledge 1108, and the aperture 1109 situated in the support ledge 1108. As noted above, in one or more embodiments the aperture 1109 is complementary in shape to the dovetail protuberance 616.

Another feature shown in FIG. 12 is a slot 1201 positioned in the read sidewall 1105. As will be shown in subsequent figures, the latching tab 801 situates within the slot 1201 when the chassis cover 101 engages the chassis base 1102, thereby limiting potential deflection of the cantilever arm 601 when the assembled chassis is moved or transported.

Figure 13:
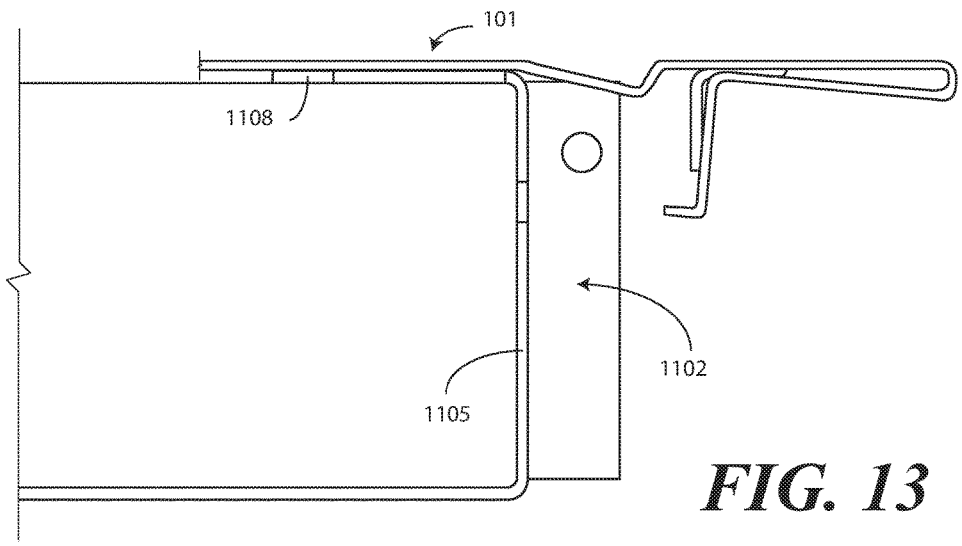
FIG. 13 illustrates one or more method steps in accordance with one or more embodiments of the disclosure.

Turning now to FIG. 13, the chassis cover 101 has been positioned such that it abuts the support ledge 1108. The latch member 107 is still disposed to the right of the rear sidewall 1105. From this position, the chassis cover 101 can be slid to the right to engage the chassis base 1102. As will be shown in FIG. 16 below, this sliding action allows the offset extension (403) to engage the receiver ledge (1107) by sliding under the receiver ledge (1107).

Figure 14:
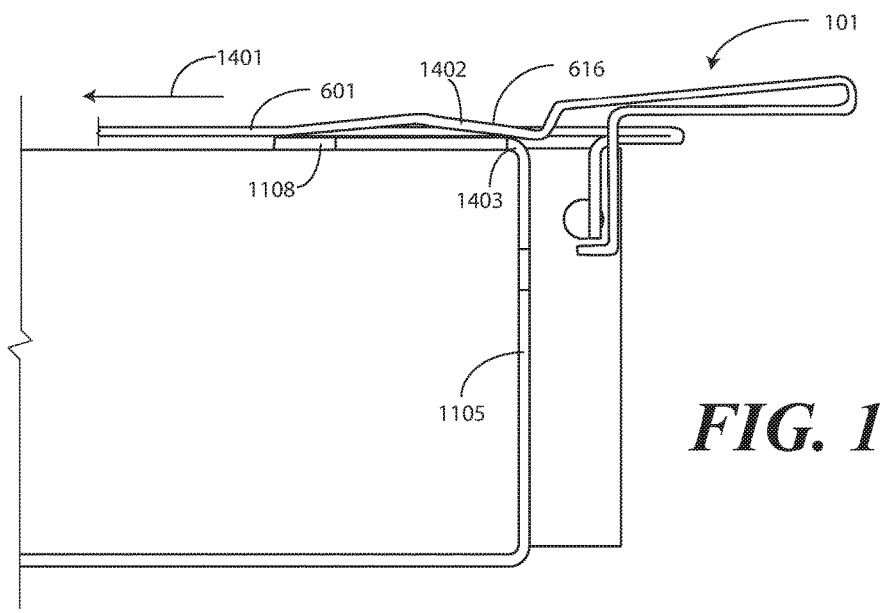
FIG. 14 illustrates one or more method steps in accordance with one or more embodiments of the disclosure.

Turning now to FIG. 14, as the chassis cover 101 translates 1401 to the left, with the offset extension (403) engages the receiver ledge (1107) by sliding under the receiver ledge (1107), the front side 1402 of the dovetail protuberance 616 mechanically engages a corner 1403 defined between the rear sidewall 1105 and the support ledge 1108. Since the front side 1402 of the dovetail protuberance 616 and the cantilever arm 601 define an obtuse angle, the front side 1402 of the dovetail protuberance 616 rides along the corner 1403. This causes the cantilever arm 601 to deflect, as shown in FIG. 14.

Figure 15:
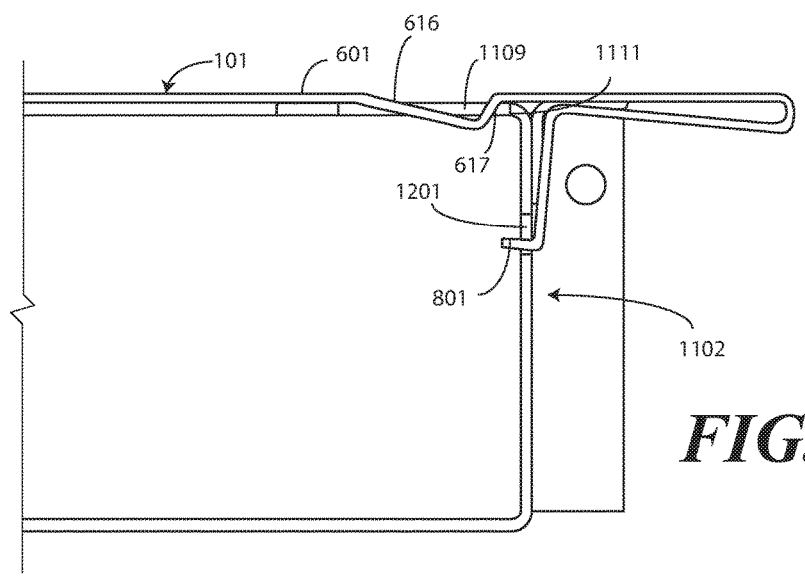
FIG. 15 illustrates one or more method steps in accordance with one or more embodiments of the disclosure.
Figure 16:
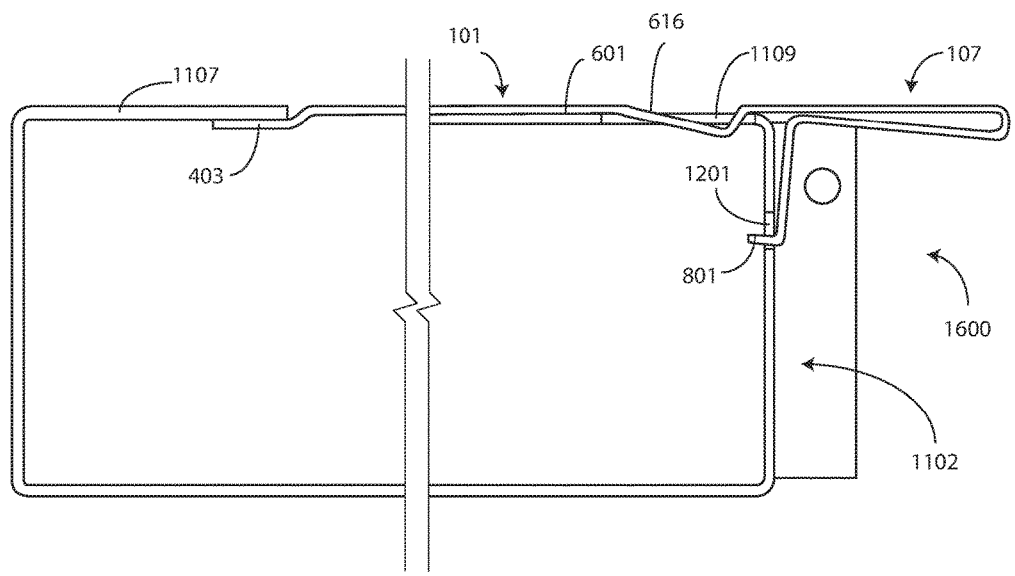
FIG. 16 illustrates a sectional view of an assembled chassis in accordance with one or more embodiments of the disclosure.

Turning now to FIG. 15, when the chassis cover 101 slides across the chassis base 1102, with the offset extension (403) sliding under the receiver ledge (1107), and once the dovetail protuberance 616 passes atop the aperture 1109, the cantilever arm 601 reverses the deflection. This causes the dovetail protuberance 616 to situate within the aperture 1109. Moreover, the latching tab 801 situates within the slot 1201. This results in the base 617 of the dovetail protuberance 616 being situated against a first side 1111 of the aperture 1109. The resulting system 1600 is shown in FIG. 16. As shown, the offset extension 403 of the chassis cover 101 is situated under the receiver ledge 1107 of the chassis base 1102.

To remove the chassis cover 101 from the chassis base 1102, the steps of FIGS. 12-15 are reversed. A user would first lift the latch member 107, thereby deflecting the cantilever arm 601 upward to release the dovetail protuberance 616 from the aperture 1109. Note that the upward deflection of the cantilever arm 601 is limited by the fact that the latching tab 801 is situated within the slot 1201. Once the dovetail protuberance 616 clears the aperture 1109, the chassis cover 101 can be removed from the chassis base 1102 by sliding the chassis cover to the left (as illustrated in FIG. 16).

Thus, as shown in FIGS. 6-16, embodiments of the disclosure provide for a novel and unique chassis cover 101. The new chassis cover 101 includes a latch member 107. In one or more embodiments, the latch member includes a dovetail protuberance 616. The number of latch members 107 included along the chassis cover 101 may be varied depending upon the cover design and the chassis dimensions.

In one or more embodiments, the latch member 107 is located at the rear section of the cover member 108. The latch members 107 are designed with a dovetail protuberance 616, which in one embodiment is configured particularly as a wedge portion and a triangle punch shaped section.

The dovetail protuberance 616 helps the latch member 107 slide the cover over the rear sidewall 1105 of a chassis base 1102 when the chassis cover 101 is attached to the chassis base 1102. The narrow end of the dovetail protuberance 616, i.e., the apex opposite the base 617 of the dovetail protuberance, helps to facilitate the engagement, while the base 617 of the dovetail protuberance keeps enough interference for a strong attachment about the rear sidewall 1005 of a chassis base 1002, or alternatively within an aperture 1109 of a support ledge 1108, thereby reducing the risk of disassembly.

Additionally, as noted above in one or more embodiments the cantilever arm 601 extends 605 distally from an interior 606 of the cover member 108 beyond the first edge 607 of the cover member 108 and terminates at a loop 612, while the major latch arm 603 extends back toward the interior 606 of the cover member 108 from the loop. This cantilever arm 601 to loop 612 to major latch arm 603 defines an extended teardrop hem feature at the end of the latch member 107. Advantageously, this extended teardrop hem feature works as point of support (or handle) for the user to detach the chassis cover 101 from a chassis base 1102 by hand.

To remove the chassis cover 101 from a chassis base 1102, a user pulls up these extended teardrop hem features, with the intent to deflect the cantilever arm 601. This deflection of the cantilever arm 601 allows the dovetail protuberance 616 to move over and above the rear sidewall 1005 of the chassis base 1002, or out and above the apertures 1109 disposed in the support ledge 1108 of another chassis base 1102. The chassis cover 101 can then be slid backwards until the dovetail protuberance 616, shown to include a triangle punch shaped section in this illustrative embodiment, disengages the rear sidewall 1005,1105 of the chassis base 1002,1102.

As noted above, in one or more embodiments the latch member 107 also includes a latching tab 801 located at the lower part. In one or more embodiments the latching tab 801 fits into a slot 1201, which is an opening located at the rear sidewall 1005,1105 of the chassis base 1002,1102. When the chassis cover 101 is attached to the chassis base 1002,1102, the latching tab 801 and its positioning within the slot 1201 restricts the movement of the latch member 107, thereby helping to reduce the possibility of deformation of the latch member 107. In one or more embodiments, the latching tab 801 comprises cutouts or openings at the beginning of the sections, which help to prevent and reduce the risk for the sheet metal to be deformed according to yield strength.

In one or more embodiments, the chassis base 1102 can include a support ledge 1108 that includes apertures 1109, 1110 at the rear section with a complementary shape to that of the dovetail protuberances 616. In one or more embodiments, while the dovetail protuberances 616 are punched, the apertures 1109,1110 are cut out of the support ledge 1108. Where included, the main purpose of the apertures 1109,1110 is to engage with the dovetail protuberances 616 once the chassis cover 101 is slid over the chassis base 1002,1102 to attach the chassis cover 101 to the chassis base 1002,1102. Embodiments of the disclosure advantageously provide an easy and fast method for attaching and detach a chassis cover 101 to and from a chassis base 1002,1102.

Moreover, the specific geometry of the dovetail protuberances 616, which refers to the punch with the specific triangle shape, the coupling between the chassis cover 101 and the chassis base 1002,1102 is secure. Also, the positioning of the latching tab 801 within the slot 1201 prevents any over-deflection or over-stressing of the cantilever arm 601 of the latch member 107 during disassembly operation. This system can be implemented in order to reduce the use of screws and tools. Also this solution can be implemented for different products, across different rack mount platforms.

Figure 17:
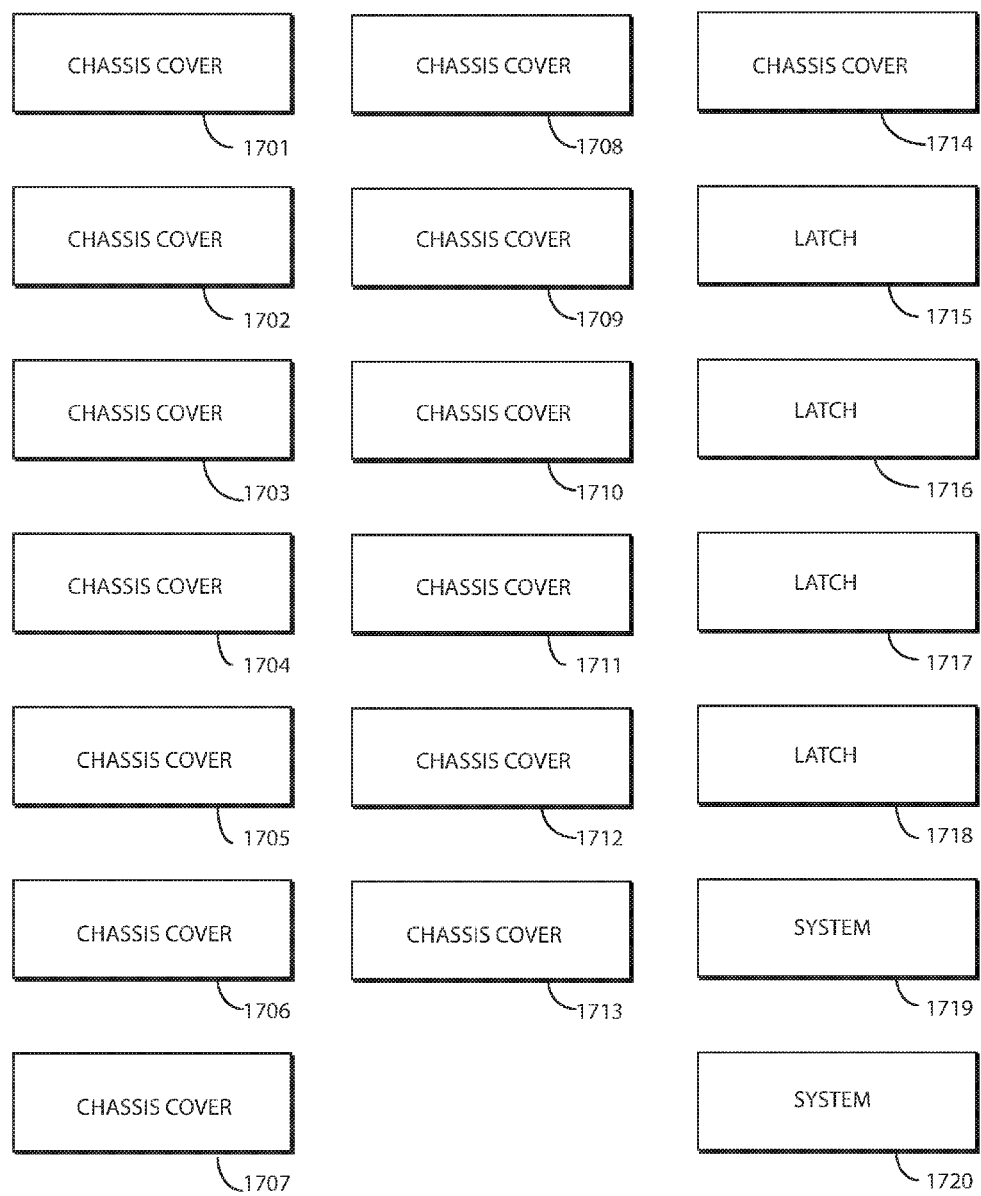
FIG. 17 illustrates one or more embodiments of the disclosure.

Turning now to FIG. 17, illustrated therein are various embodiments of the disclosure. At 1701, a chassis cover comprises a cover member having a first edge and a second edge. At 1701, the cover member comprises at least one latch member. At 1701, the at least one latch member comprises a cantilever arm extending distally outward from an interior of the cover member beyond the first edge by a first distance. At 1701, the cantilever arm terminates at a loop. At 1701, a latch arm extends distally inward from the loop a second distance. At 1701, the second distance is greater than the first distance. At 1701, a latching tab extends distally from an end of the latch arm.

At 1702, the cover member of 1701 is substantially planar. At 1703, the latch arm of 1701 comprises a major latch arm and a minor latch arm. At 1703, the major latch arm and the minor latch arm define a first L-shape. At 1704, the latching tab of 1703 is shorter in length than the minor latch arm.

At 1703, the latching tab of 1703 and the minor latch arm define a second L-shape. At 1706, the major latch arm of 1705 and the latching tab are substantially parallel. At 1707, the major latch arm is bendably connected to the cantilever arm by the loop.

At 1708, a junction defined by an intersection of the major latch arm of 1707 and the minor latch arm abuts the cantilever arm. At 1709, the loop of 1708 biases the junction bend against the cantilever arm.

At 1710, the cantilever arm of 1703 defines a dovetail protuberance extending distally from the cantilever arm toward the latching tab to a nadir. At 1711, the dovetail protuberance of 1710 defines a base at the cantilever arm having a triangular cross section. At 1712, a first side of the triangular cross section of 1711 is substantially parallel with the first edge.

At 1713, the dovetail protuberance of 1710 is situated interior of the first edge. At 1714, the first edge of 1701 is situated to a first side of the at least one latch member. At 1714, a portion of the cover member situated to a second side of the at least one latch member is folded over the cover member to define an abutment surface extending substantially orthogonally from the cover member.

At 1715, a latch for a chassis cover comprises a cantilever arm extending distally in a first direction by a first distance to terminate at a loop. At 1715, a latch arm extends distally in a second direction, opposite the first direction, from the loop by a second distance. At 1715, the second distance is greater than the first distance. At 1715, a latching tab extends distally from an end of the latch arm. At 1715, the cantilever arm defines a dovetail protuberance extending distally from a major face of the cantilever arm toward the latching tab to a nadir.

At 1716, the latch arm of 1715 is bendably connected to the cantilever arm by the loop. At 1717, the latch arm of 1716 comprises a major latch arm and a minor latch arm. At 1717, the loop of 1716 preloads a junction bend defined by an intersection of the major latch arm and the minor latch arm, thereby causing the junction bend to abut the cantilever arm. At 1718, a portion of the cantilever arm, the loop, and a portion of the latch arm define a teardrop cross section.

At 1719, a system comprises a chassis and a cover for the chassis. At 1719, the cover comprises a first latch and a second latch. At 1719, each of the first latch and the second latch comprise a cantilever arm extending from a major face of the cover beyond a first edge of the major face to a loop, a latch arm extending toward the first edge from the loop, and a latching tab extending distally from an end of the latch arm. At 1719, the cantilever arm defines a dovetail protuberance extending distally from a major face of the cantilever arm toward the latching tab to a nadir. AT 1720, a second edge of the cover of 1719 defines an offset extension that is parallel, but non-coplanar, with the major face of the cover.

In the foregoing specification, specific embodiments of the present disclosure have been described. However, one of ordinary skill in the art appreciates that various modifications and changes can be made without departing from the scope of the present disclosure as set forth in the claims below. Thus, while preferred embodiments of the disclosure have been illustrated and described, it is clear that the disclosure is not so limited. Numerous modifications, changes, variations, substitutions, and equivalents will occur to those skilled in the art without departing from the spirit and scope of the present disclosure as defined by the following claims. Accordingly, the specification and figures are to be regarded in an illustrative rather than a restrictive sense, and all such modifications are intended to be included within the scope of present disclosure. The benefits, advantages, solutions to problems, and any element(s) that may cause any benefit, advantage, or solution to occur or become more pronounced are not to be construed as a critical, required, or essential features or elements of any or all the claims.

What is claimed is:

1. A chassis cover, comprising:
   a cover member having a first edge and a second edge;
   at least one latch member comprising:
      a cantilever arm extending distally outward from an interior of the cover member beyond the first edge by a first distance, the cantilever arm terminating at a loop;
      a latch arm extending distally inward from the loop a second distance, wherein the second distance is greater than the first distance; and
      a latching tab extending distally from an end of the latch arm;

wherein the cantilever arm defines a dovetail protuberance extending distally from the cantilever arm toward the latching tab to a nadir.

2. The chassis cover of claim 1, wherein the cover member is substantially planar.

3. The chassis cover of claim 1, wherein the latch arm comprises a major latch arm and a minor latch arm, wherein the major latch arm and the minor latch arm define a first L-shape.

4. The chassis cover of claim 3, wherein the latching tab is shorter in length than the minor latch arm.

5. The chassis cover of claim 3, wherein the latching tab and the minor latch arm define a second L-shape.

6. The chassis cover of claim 5, wherein the major latch arm and the latching tab are substantially parallel.

7. The chassis cover of claim 5, wherein the major latch arm is bendably connected to the cantilever arm by the loop.

8. The chassis cover of claim 7, wherein a junction bend defined by an intersection of the major latch arm and the minor latch arm abuts the cantilever arm.

9. The chassis cover of claim 8, wherein the loop biases the junction bend against the cantilever arm.

10. The chassis cover of claim 1, wherein the dovetail protuberance defines a base at the cantilever arm having a triangular cross section.

11. The chassis cover of claim 10, wherein a first side of the triangular cross section is substantially parallel with the first edge.

12. The chassis cover of claim 1, wherein the dovetail protuberance is situated interior of the first edge.

13. The chassis cover of claim 1, wherein the first edge is situated to a first side of the at least one latch member, wherein a portion of the cover member situated to a second side of the at least one latch member is folded over the cover member to define an abutment surface extending substantially orthogonally from the cover member.

14. A latch for a chassis cover, the latch comprising:
a cantilever arm extending distally in a first direction by a first distance to terminate at a loop;
a latch arm extending distally in a second direction, opposite the first direction, from the loop by a second distance, wherein the second distance is greater than the first distance; and
a latching tab extending distally from an end of the latch arm;
wherein the cantilever arm defines a dovetail protuberance extending distally from a major face of the cantilever arm toward the latching tab to a nadir.

15. The latch of claim 14, wherein the latch arm is bendably connected to the cantilever arm by the loop.

16. The latch of claim 15, wherein the latch arm comprises a major latch arm and a minor latch arm, the loop preloading a junction bend defined by an intersection of the major latch arm and the minor latch arm causing the junction bend to abut the cantilever arm.

17. The latch of claim 14, wherein a portion of the cantilever arm, the loop, and a portion of the latch arm define a teardrop cross section.

18. A system, comprising:
a chassis; and
a cover for the chassis, the cover comprising a first latch and a second latch, each of the first latch and the second latch comprising:
a cantilever arm extending from a major face of the cover beyond a first edge of the major face to a loop;
a latch arm extending toward the first edge from the loop; and
a latching tab extending distally from an end of the latch arm;
wherein the cantilever arm defines a dovetail protuberance extending distally from the major face of the cantilever arm toward the latching tab to a nadir.

19. The system of claim 18, wherein a second edge of the cover defines an offset extension that is parallel, but non-coplanar, with the major face of the cover.

\* \* \* \* \*